United States Patent
Okamoto et al.

(10) Patent No.: US 7,870,991 B2
(45) Date of Patent: Jan. 18, 2011

(54) ELECTRONIC COMPONENT MOUNTING SYSTEM AND ELECTRONIC COMPONENT MOUNTING METHOD

(75) Inventors: Kazuo Okamoto, Fukuoka (JP); Syoichi Nishi, Fukuoka (JP); Takeshi Morita, Fukuoka (JP); Masanori Hiyoshi, Fukuoka (JP); Kazuhiko Tomoyasu, Fukuoka (JP)

(73) Assignee: Panasonic Corporation, Osaka (JP)

( * ) Notice: Subject to any disclaimer, the term of this patent is extended or adjusted under 35 U.S.C. 154(b) by 80 days.

(21) Appl. No.: 12/377,903

(22) PCT Filed: Sep. 6, 2007

(86) PCT No.: PCT/JP2007/067780

§ 371 (c)(1),
(2), (4) Date: Feb. 18, 2009

(87) PCT Pub. No.: WO2008/032756

PCT Pub. Date: Mar. 20, 2008

(65) Prior Publication Data

US 2010/0230472 A1    Sep. 16, 2010

(30) Foreign Application Priority Data

Sep. 11, 2006  (JP)  .............................. 2006-245229

(51) Int. Cl.
*B23K 31/02* (2006.01)
*B23K 37/00* (2006.01)

(52) U.S. Cl. ............................. 228/103; 228/9; 228/41; 228/49.5; 228/180.22; 228/248.1

(58) Field of Classification Search ....................... None
See application file for complete search history.

(56) References Cited

U.S. PATENT DOCUMENTS

| | | | | |
|---|---|---|---|---|
| 5,411,897 A | * | 5/1995 | Harvey et al. .................. | 438/16 |
| 5,693,559 A | * | 12/1997 | Taniguchi et al. .............. | 427/8 |
| 5,862,973 A | * | 1/1999 | Wasserman .................. | 228/105 |
| 5,872,400 A | * | 2/1999 | Chapman et al. ............. | 257/738 |
| 5,882,720 A | * | 3/1999 | Legault et al. .................. | 427/8 |

(Continued)

FOREIGN PATENT DOCUMENTS

JP    05-116273 A  *  5/1993

(Continued)

OTHER PUBLICATIONS

International Search Report for PCT/JP2007/067780.

*Primary Examiner*—Kiley Stoner
(74) *Attorney, Agent, or Firm*—Pearne & Gordon LLP

(57) ABSTRACT

In a mounting system having a height measuring instrument for measuring the height of solder paste printed on the electrodes and an electronic component placing apparatus, whether the height of solder paste is right or wrong is determined based on the measurement result of measuring the height of solder paste printed on the electrode. Further, whether or not the transfer of solder paste to the solder bump is required based on the determination result, and if it is determined that the transfer is required, the paste is transferred to an electronic component held in a mounting head. Thereby, the mounting quality can be assured by adding adequately an amount of solder in treating the board causing a shortage of the solder amount due to printing failure.

4 Claims, 11 Drawing Sheets

U.S. PATENT DOCUMENTS

| | | | |
|---|---|---|---|
| 2002/0070460 A1 * | 6/2002 | Uchida et al. | 257/780 |
| 2003/0003706 A1 | 1/2003 | Suzuki | |
| 2004/0244613 A1 * | 12/2004 | Barajas et al. | 101/130 |
| 2005/0254066 A1 * | 11/2005 | Mamiya et al. | 356/604 |
| 2006/0000872 A1 * | 1/2006 | Nakagawa et al. | 228/56.5 |
| 2006/0071052 A1 * | 4/2006 | Conlon et al. | 228/103 |
| 2006/0086773 A1 * | 4/2006 | Sanftleben et al. | 228/103 |
| 2006/0249303 A1 * | 11/2006 | Johnson et al. | 174/261 |
| 2007/0090164 A1 * | 4/2007 | Barajas et al. | 228/101 |
| 2007/0130755 A1 * | 6/2007 | Duquette et al. | 29/740 |
| 2007/0137559 A1 * | 6/2007 | Kimura et al. | 118/256 |
| 2008/0083816 A1 * | 4/2008 | Leinbach et al. | 228/102 |
| 2009/0014501 A1 * | 1/2009 | Nishi et al. | 228/103 |
| 2010/0001042 A1 * | 1/2010 | Nagai | 228/102 |

FOREIGN PATENT DOCUMENTS

| | | | |
|---|---|---|---|
| JP | 05-296731 A | * | 11/1993 |
| JP | 05-296731 A | | 11/1993 |
| JP | 05-296733 A | * | 11/1993 |
| JP | 08-323956 A | * | 12/1996 |
| JP | 2002-134899 A | | 5/2002 |
| JP | 2005-030774 A | * | 2/2005 |
| JP | 2005-303181 A | * | 10/2005 |
| JP | 2005-305806 A | | 11/2005 |
| JP | 2007-134406 A | * | 5/2007 |
| WO | 01-88473 A1 | | 11/2001 |
| WO | 2007-116848 A1 | | 10/2007 |

* cited by examiner

ELECTRONIC COMPONENT MOUNTING SYSTEM AND ELECTRONIC COMPONENT MOUNTING METHOD

TECHNICAL FIELD

The present invention relates to an electronic component mounting system and an electronic component mounting method for mounting an electronic component on a board to manufacture a mounted board.

BACKGROUND ART

An electronic component mounting system for mounting an electronic component on a board by means of soldering to manufacture a mounted board is constituted by connecting a plurality of electronic component mounting apparatuses, including a solder printing apparatus, an electronic component placing apparatus, and a reflow apparatus. In such electronic component mounting system, an electronic component mounting line with an inspection function where an inspection apparatus is disposed between each apparatus has been introduced to make the quality control at high reliability (e.g., refer to patent document 1).

In an example as described in this patent document, a printing inspection apparatus is disposed between the printing apparatus and the electronic component placing apparatus, and if the printing inspection apparatus detects a defective condition such as misregistration in the printing condition of the printing apparatus, the feedback information for correcting it is passed to the printing apparatus, and the feed forward information for performing the placing operation after correcting the influence of the defective condition is passed to the electronic component placing apparatus in the downstream operations. Thereby, the high quality control in a mounting board manufacturing process is implemented.

[Patent document 1] JP-A-2002-134899

By the way, with the reduced size of the electronic equipment in recent years, the size of electronic component to be mounted is also miniaturized, and in mounting these micro components, it is required that the amount of solder printed on the board is finely controlled. However, in a screen printing process for printing the solder on the electrodes of the board, the printing degree of difficulty is greater with the finer electrodes, whereby a dispersion in the amount of solder is likely to occur due to a bad shape of solder after printing. And if the electronic component is placed on the board in this state, a cold joint may possibly occur because the electronic component is not normally soldered to the board in the reflow process. In this manner, in the conventional electronic component mounting system, there was no effective recovery measure for the board after a shortage of the amount of solder occurs due to printing failure in the screen printing process, resulting in a problem of causing the poor mounting quality or the greater proportion defective.

DISCLOSURE OF INVENTION

Thus, it is an object of the invention to provide an electronic component mounting system and an electronic component mounting method in which the printing quality can be assured in treating the board causing a shortage of the solder amount due to printing failure.

According to the present invention, there is provided an electronic component mounting system having a plurality of electronic component mounting apparatuses connected for mounting an electronic component with a plurality of solder bumps formed on a lower surface on a board to manufacture a mounted board, the system comprising a printing apparatus for printing the solder paste on the electrodes formed corresponding to the solder bumps on the board, a paste height measuring instrument for measuring the height of solder paste printed on the electrode and determining whether the height of solder paste is right or wrong individually for each electrode based on the measurement result, an electronic component placing apparatus having a mounting head for taking the electronic component out of a component supply section and placing the electronic component on the board held in a board holding section, head movement means for moving the mounting head between the component supply section and the board holding section, and a paste transfer unit, disposed on a movement path of the mounting head, for transferring the solder paste to the solder bumps by causing the electronic component held in the mounting head to descend to a film formation face on which a film of solder paste is formed, and a paste transfer determination section for determining whether or not the transfer of solder paste by the paste transfer unit is required, based on the right or wrong determination result of the height by the paste height measuring instrument.

Also, according to the invention, there is provided an electronic component mounting method for mounting an electronic component with a plurality of solder bumps formed on a lower surface on a board to manufacture a mounted board, in which a plurality of electronic component mounting apparatuses are connected, the method including a printing step of printing the solder paste on the electrodes formed corresponding to the solder bumps on the board, a paste height measuring step of measuring the height of solder paste printed on the electrode and determining whether the height of solder paste is right or wrong individually for each electrode based on the measurement result, and a component placing step of placing the electronic component on the board after the paste height measuring step by an electronic component placing apparatus having a paste transfer unit for transferring the solder paste to the plurality of solder bumps by forming a film of solder paste on a film formation face and causing the electronic component held in the mounting head to descend to the film formation face on which the film of solder paste is formed, wherein prior to the component placing step, a paste transfer determination section determines whether or not the transfer of solder paste by the paste transfer unit is required, based on the right or wrong determination result of the height at the solder height measuring step, and if it is determined that the transfer is required, a paste transfer operation for causing the electronic component held in the mounting head to descend to the film formation face is performed.

With the invention, the right or wrong of the height of solder paste is determined based on the measurement result of measuring the height of solder paste printed on the electrode. Further whether or not the transfer of solder paste to the solder bumps is required based on this determination result, and if it is determined that the transfer is required, the paste is transferred to the electronic component held in the mounting head, whereby it is possible to assure the mounting quality by adding the adequate amount of solder in treating the board causing a shortage of the solder amount due to printing failure.

BEST MODE FOR CARRYING OUT THE INVENTION

The embodiments of the present invention will be described below with reference to the drawings.

Figure 1:
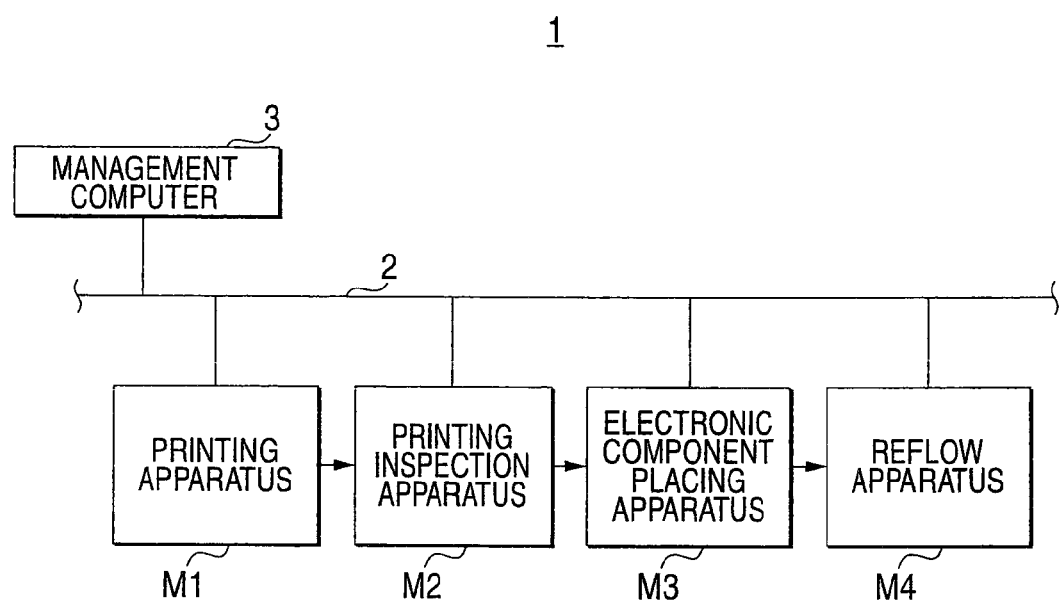
FIG. 1 is a block diagram showing the configuration of an electronic component mounting system according to one embodiment of the present invention.

Referring to FIG. 1, first of all, an electronic component mounting system will be described below. In FIG. 1, the electronic component mounting system has an electronic component mounting line 1 connected via a communication network 2, the electronic mounting line composed of a printing apparatus M1, a printing inspection apparatus M2, an electronic component placing apparatus M3 and a reflow apparatus M4, each of which is an electronic component mounting apparatus, and is totally controlled by a management computer 3. In this embodiment, with these plurality of electronic component mounting apparatuses, an electronic component with a plurality of solder bumps for connection to the outside formed on a lower surface is mounted on a board by means of soldering to manufacture a mounted board. The electronic component mounting apparatuses may be connected via the communication network 2 without using the management computer 3.

The printing apparatus M1 screen-prints the solder paste for joining the electronic component to the electrodes formed corresponding to an array of solder bumps of the electronic component on the board of mounting object. The printing inspection apparatus M2 inspects a printed state by recognizing the plane position of solder paste printed by picking up an image of the board after solder printing. The electronic component placing apparatus M3 places the electronic component on the board where the solder paste is printed, using a mounting head. The reflow apparatus M4 solders the electronic component to the board by heating the board on which the electronic component is placed and fusing the solder bumps and the solder paste due to heat.

Figure 2:
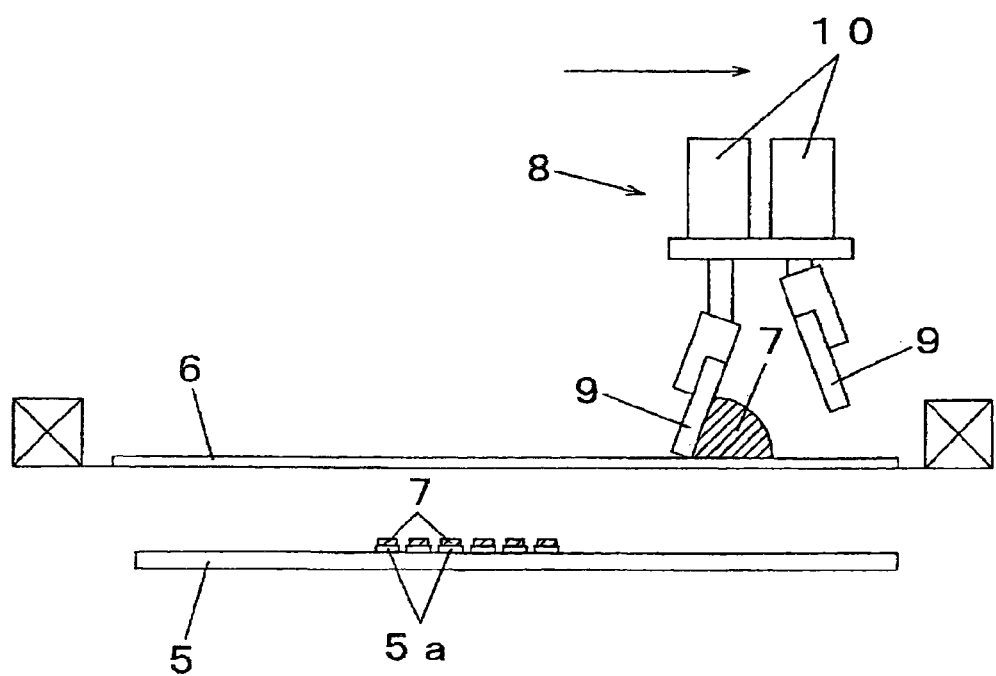
FIG. 2 is an explanatory view for explaining the solder printing in the electronic component mounting system according to one embodiment of the invention.

FIG. 2 shows the solder printing made in the printing apparatus M1. The printing apparatus M1 comprises a screen mask 6 and a squeegee mechanism 8. The board 5 on which the electronic component is mounted is positioned and held under the screen mask 6 by a board holding section (not shown). The electrodes 5a, to which the electronic component of mounting object is connected, are provided on the upper surface of the board 5. The squeegee mechanism 8 in which two printing squeegees 9 can be moved up or down by the lift mechanisms 10 is disposed above the screen mask 6. The squeegee mechanism 8 is movable horizontally by a horizontal movement mechanism (not shown). The solder paste 7 is printed on the electrodes 5a via the pattern holes (not shown) punched in the screen mask 6 by horizontally moving the squeegee mechanism 8 while sliding the printing squeegee 9 with the upper surface of the screen mask 6 in a state where the board 5 is contacted with the lower surface of the screen mask 6 and the solder paste 7 is supplied onto the upper surface of the screen mask 6.

Figure 3:
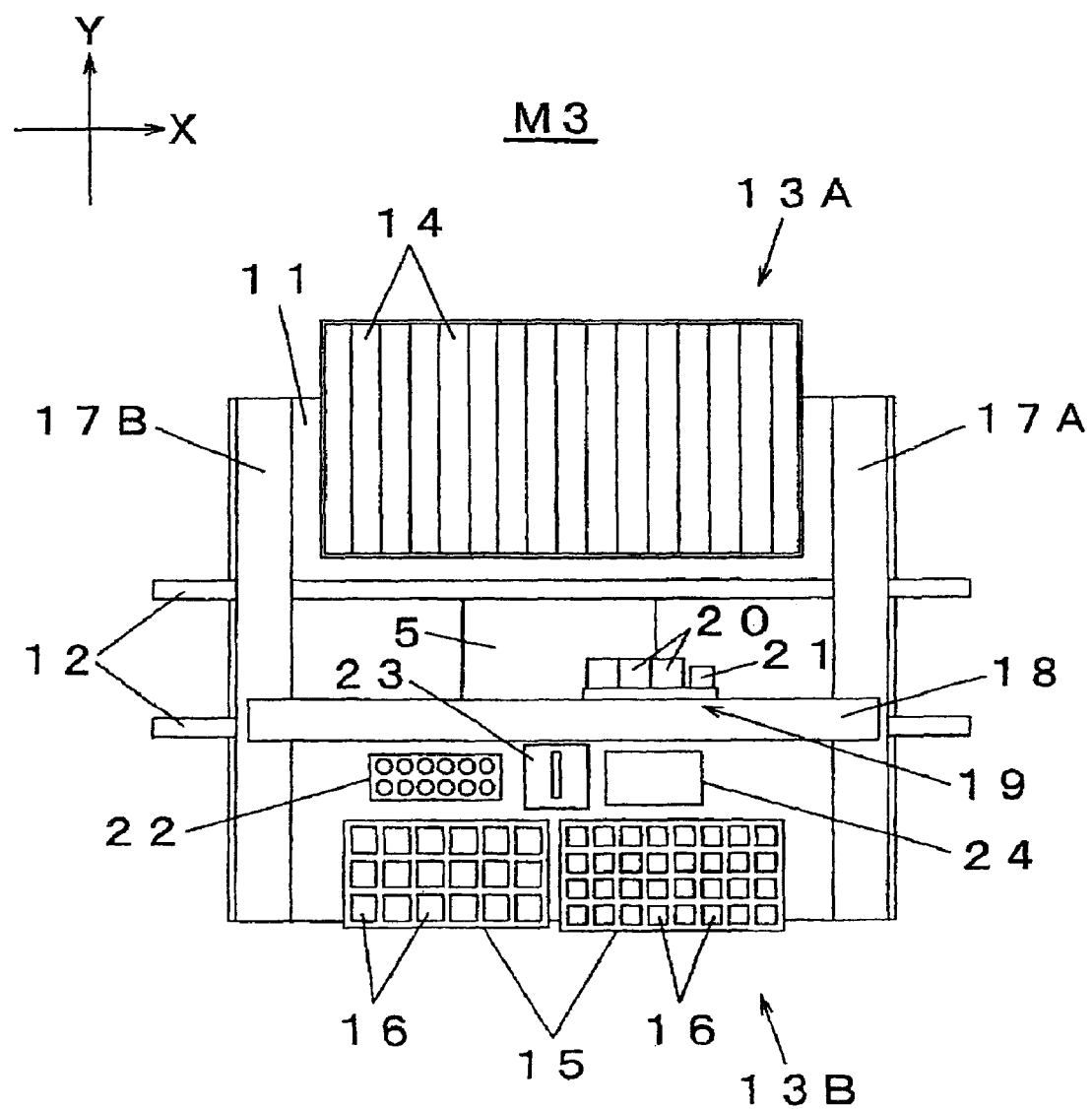
FIG. 3 is a plan view of an electronic component placing apparatus according to one embodiment of the invention.

Referring now to FIG. 3, the structure of the electronic component placing apparatus M3 will be described below. In FIG. 3, the conveying paths 12 extend in the X direction (board conveying direction) in the central portion of a base 11. The conveying paths 12 convey the board 5 on which the electronic component is mounted and hold and position the board 5 at the electronic component mounting position. Accordingly, the conveying paths 12 serve as the board holding section for holding and positioning the board 5. A first component supply section 13A and a second component supply section 13B, which supply the electronic component, are disposed on both sides of the conveying paths 12.

A plurality of tape feeders 14 are disposed in the first component supply section 13A. The tape feeders 14 feed by pitch a tape holding the electronic component such as a terminal chip type component, and supply the electronic component to a pickup position of the mounting head, as will be described in the following. Two tray feeders 15 are disposed in parallel in the second component supply section 13B. The two tray feeders 15 supply the electronic components 16 of different kinds to the pickup positions of the mounting head in grid array. The electronic components 16 include a semiconductor package in which the semiconductor device is mounted on the resin board of thin type such as BGA and a small component with bump. In this embodiment, the electronic component 16 is connected with the board via a plurality of solder bumps formed on the lower surface, such as the semiconductor package.

A Y-axis table 17A and a Y-axis guide 17B are disposed on both end portions of the base 11 in the X direction. An X-axis table 18 is installed between the Y-axis table 17A and the Y-axis guide 17B. Further, a mounting head 19 is attached on the X-axis table 18. The mounting head 19 is the multiple type having a plurality of unit mounting heads 20, and moved integrally with a board recognition camera 21.

The mounting head 19 is moved in the X-Y directions by driving the X-axis table 18 and the Y-axis table 17A. The electronic component is taken out of the first component supply section 13A and the second component supply section 13B by an adsorption nozzle 20a (see FIG. 10) of the unit mounting head 20, and placed on the board 5 positioned and held on the conveying paths 12. The X-axis table 18 and the Y-axis table 17A constitute head movement means for moving the mounting head 19 between the first component supply section 13A and the second component supply section 13B and the conveying paths 12.

A component recognition camera 23, a nozzle stocker 22 and a paste transfer unit 24 are disposed on the movement path of the mounting head 19 between the conveying paths 12 and the second component supply section 13B. When the mounting head 19 picking up the electronic component from each component supply section passes above the component recognition camera 23 on the way to the board 5, the electronic component held in the mounting head 19 is recognized.

The nozzle stocker 22 accommodates plural kinds of adsorption nozzle in accordance with the kind of electronic component placed on the board 5. When the mounting head 19 makes access to the nozzle stocker 22, the adsorption nozzle according to the electronic component to be placed is selected and attached. The paste transfer unit 24 has a function of forming a thin film of solder paste made viscous by mixing solder components into flux on the film formation face. By causing the electronic component held in the mounting head 19 to descend to the film formation face of the paste transfer unit 24, the solder paste is transferred and supplied to plural solder bumps formed on the lower surface of the electronic component. The transfer and supply of the solder paste is intended to improve the reliability of solder joint by adding the amount of solder in soldering the solder bumps with the electrodes of the board 5.

Figure 4:
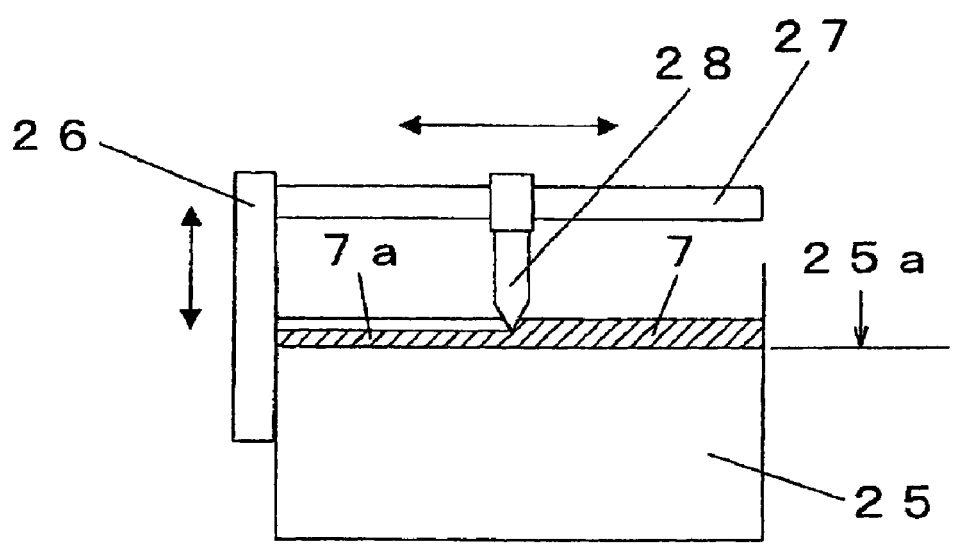
FIG. 4 is an explanatory view for explaining the structure of a paste transfer unit in the electronic component placing apparatus according to one embodiment of the invention.

Referring to FIG. 4, the constitution of the paste transfer unit 24 provided in the electronic component placing apparatus M3 will be described below. In FIG. 4, a smooth film formation face 25a is provided on the upper surface of a base portion 25. A film 7a of the solder paste 7 to be transferred and supplied to the solder bumps 16a formed on the electronic component 16 is formed on the film formation face 25a through a film formation operation for spreading the solder paste 7 by a squeegee 28.

The base portion 25 is provided with a vertical movement mechanism 26 and a horizontal movement mechanism 27 for allowing the squeegee 28 to make the film formation operation. The squeegee 28 is attached on the horizontal movement mechanism 27. The vertical movement mechanism 26, the horizontal movement mechanism 27 and the squeegee 28 are driven by a squeegee drive section 45 (see FIG. 7). That is, the squeegee 28 is moved horizontally by driving the horizontal movement mechanism 27, and further moved up or down integrally with the horizontal movement mechanism 27 by driving the vertical movement mechanism 26. Accordingly, the squeegee 28 is driven by the squeegee drive section 35 to perform the film formation operation of combining the horizontal movement and the vertical movement on the film formation face 25a. Thereby, the film of the solder paste 7 is formed on the film formation face 25a.

Figure 5A:
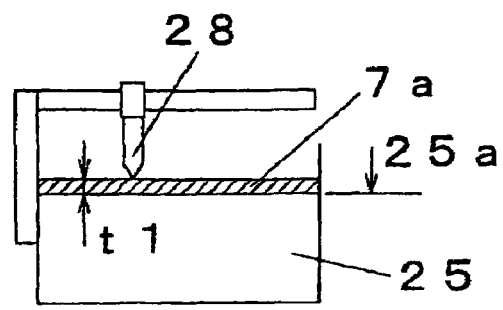
FIGS. 5A to 5D are explanatory views for explaining the operation of the paste transfer unit in the electronic component placing apparatus according to one embodiment of the invention.

FIGS. 5A to 5D show one example of the film formation operation by the squeegee 28. FIG. 5A shows an operation example where the film 7a having a uniform film thickness is formed on the film formation face 25a by spreading the solder paste 7 in film thickness t1 over the entire range of the upper surface of the film formation face 25a with the squeegee 28. When the solder paste 7 is transferred evenly to the solder bumps 16a of transfer object, the film formation is made as shown in FIG. 5.

Figure 5B:
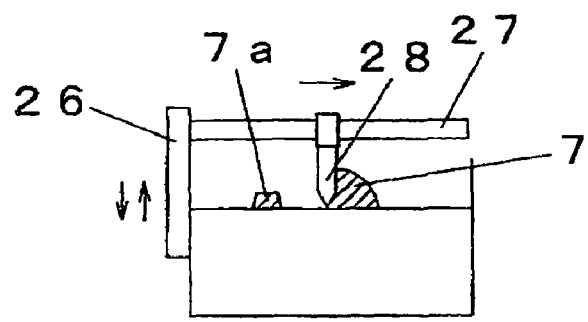
Figure 5C:
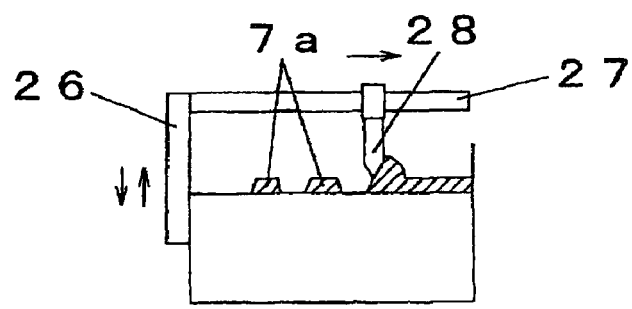

On the contrary, when the solder paste 7 is transferred to only specific ones of the plural solder bumps 16a, or when the transfer amount is changed for every solder bump 16a of transfer object, the film formation is made by changing the film formation range or film thickness as described in the following. That is, the squeegee 28 is caused to perform the film formation operation of combining the horizontal movement and the vertical movement in a predetermined pattern with the vertical movement mechanism 26 and the horizontal movement mechanism 27, as shown in FIGS. 5B and 5C.

Figure 5D:
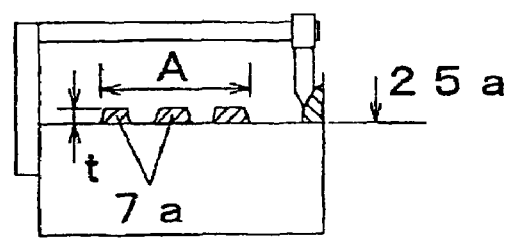

Thereby, the film 7a having any film thickness t, any plane shape and any film thickness distribution can be formed in a specific range A of the film formation face 25a, shown in FIG. 5D. Thereby, in the transfer and supply of the solder paste 7 to the solder bumps 16a, a desired amount of solder paste 7 can be selectively transferred and supplied to the specific ones of the plural solder bumps 16a for the electronic component 16, as will be described later.

Figure 6:
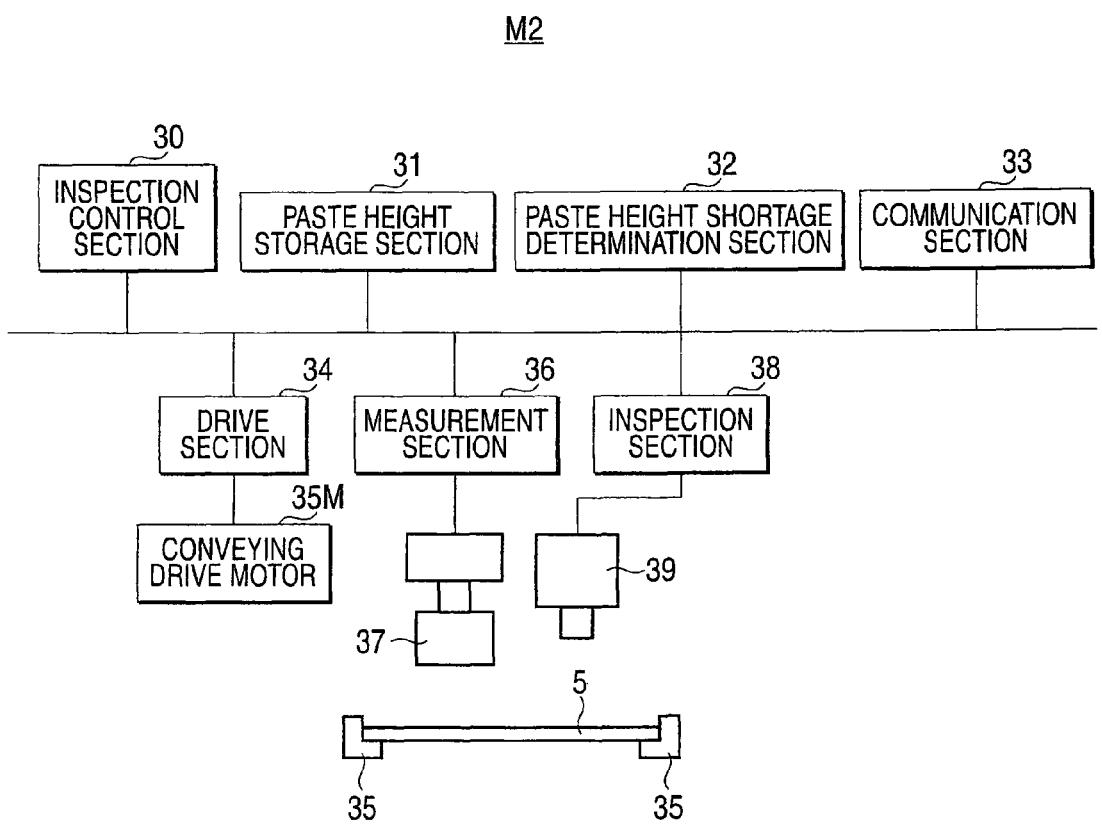
FIG. 6 is a block diagram showing the configuration of a control system in the printing inspection apparatus according to one embodiment of the invention.

Referring to FIG. 6, the functions of the printing inspection apparatus M2 and the configuration of the control system will be described below. In FIG. 6, the board 5 after the solder printing is made in the printing apparatus M1 is conveyed by a conveying positioning mechanism 35, and positioned and held at a predetermined inspection position. A conveying drive motor 35M that is a drive source of the conveying positioning mechanism 35 is driven by a drive section 34. A height measuring instrument 37 and a camera 39 are disposed above the board 5, and have the following functions.

The camera 39 picks up the image of a portion of the board 5 to conduct printing inspection. And an inspection section 38 inspects the printed state of solder paste by making the recognition processing for this picked up image. The height measuring instrument 37 has a function of measuring the distance to the measurement object precisely, and measures the height of the solder paste 7 in the printed state by making the measurement for the solder paste 7 printed on the electrodes 5a and processing the measured data in a measurement section 36. Measuring this height of the solder paste 7 is equivalent to measuring the thickness of the solder paste 7 printed on the electrodes 5a, namely, the print amount of solder paste 7 printed on each electrode 5a.

A paste height storage section 31 stores the height measurement result by the height measuring instrument 37 and the measuring section 36 as the paste height measured data. And a paste height shortage determination section 32 determines whether or not the height of the solder paste 7 printed on the each electrode 5a is adequate for the paste height measured data stored in the paste height storage section 31. That is, it is determined whether the height of the solder paste 7 printed on the electrode 5a is right or wrong by comparing the paste height measured data with the reference height data prestored in the paste height shortage determination section 32.

This height right or wrong determination result and printed state inspection result are transferred via a communication section 33 and the communication network 2 to the management computer 3 or another apparatus. An inspection control section 30 has a function of controlling the drive section 34, the height measuring section 36 and the camera 39 for the inspection and measurement operation. Accordingly, the printing inspection apparatus M2 is the paste height measuring apparatus that measures the height of the solder paste 7 printed on the electrode 5a, and determines whether or not the height of the solder paste 7 is right or wrong individually for each electrode, based on this measurement result.

Figure 7:
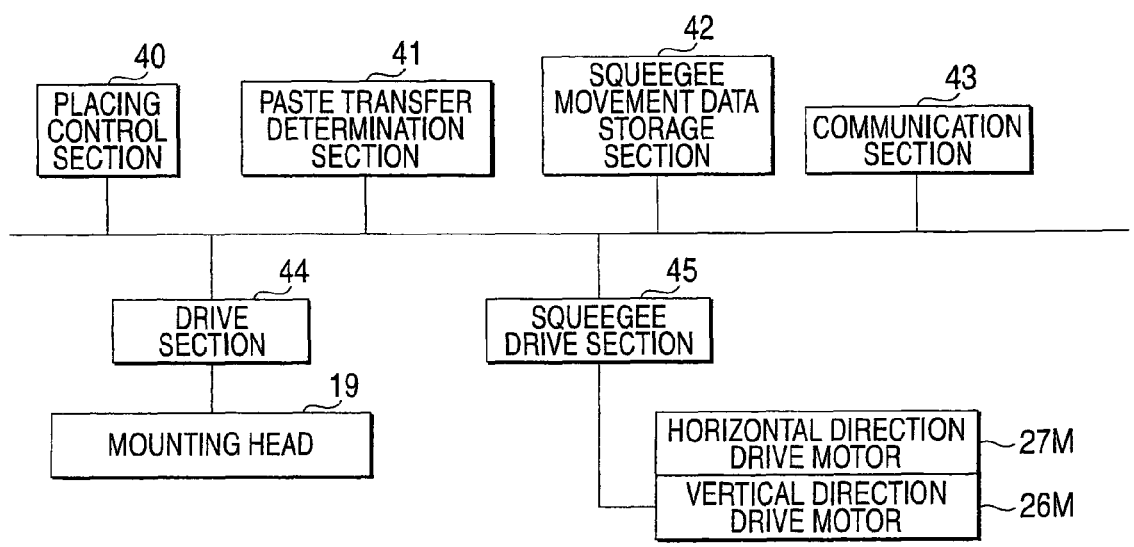
FIG. 7 is a block diagram showing the configuration of a control system in the electronic component placing apparatus according to one embodiment of the invention.

Referring to FIG. 7, the configuration of a control system in the electronic component placing apparatus M3 will be described below. A placing control section 40 is the overall control section having a CPU and controls the operation or process of each section as described below. A paste transfer determination section 41 determines whether or not the transfer of the solder paste 7 by the paste transfer unit 24 is required based on the right or wrong determination result of the paste height transferred from the printing inspection apparatus M2. This determination is made based on the preset reference, that is, the percentage of the number of electrodes determined as height shortage to the total number of electrodes or the individual preset threshold value for the extent of each height shortage.

A squeegee movement data storage section 42 stores a pattern of the film formation operation performed in the paste transfer unit 24, namely, an operation pattern of combining the horizontal and vertical movement of the squeegee 28, if the paste transfer determination section 41 determines that the transfer of the solder paste is required. A head drive section 44 drives a mounting head 19. A squeegee drive section 45 drives a vertical direction drive motor 26M and a horizontal direction drive motor 27M that are drive sources of the vertical movement mechanism 26 and the horizontal movement mechanism 27. A placing control section 40 controls the squeegee drive section 45, based the height measurement result and the squeegee movement data stored in the squeegee movement data storage section 42, to form the film 7a corresponding to the paste transfer amount distribution required for correcting the height distribution of solder paste for each electrode 5a on the board 5.

Figure 8:
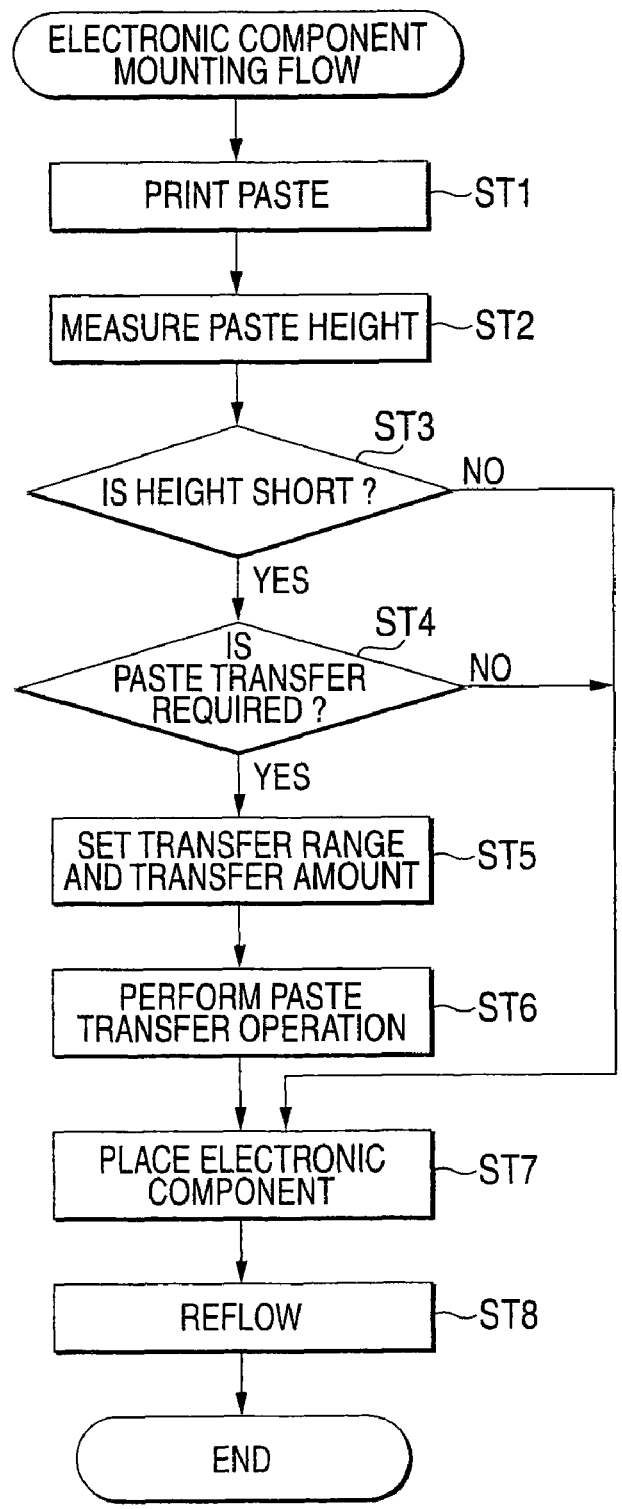
FIG. 8 is a flowchart showing an electronic component mounting method according to one embodiment of the invention.
Figure 9A:
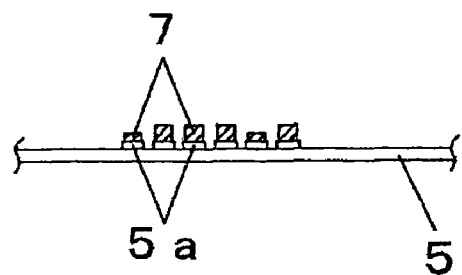
FIGS. 9A to 9C are explanatory views showing the process of the electronic component mounting method according to one embodiment of the invention.

Referring to a flowchart of FIG. 8, an electronic component mounting method for use in this electronic component mounting system will be described below. This electronic component mounting method involves placing the electronic component 16 formed with a plurality of solder bumps 16a on the lower surface on the board 5, and mounting it. First of all, the solder paste 7 is printed on the board 5 of mounting object in the printing apparatus M1 (printing process) (ST1). Thereby, the solder paste 7 is screen-printed on each electrode 5a formed on the board 5, as shown in FIG. 9A.

Figure 9B:
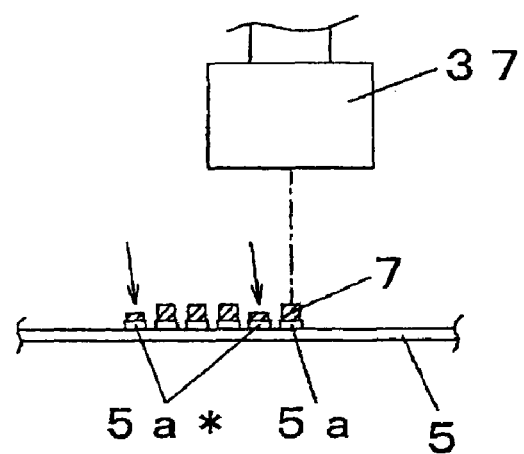

The board 5 after printing is carried into the printing inspection apparatus M2, where the printing state for each electrode 5a is inspected, and the paste height is measured (paste height measuring process) (ST2). That is, the height measuring instrument 37 is moved above the electrodes 5a successively, the upper surface of the film 7a is measured in height, and the measurement result is stored in the paste height storage section 31, as shown in FIG. 9B. In this example, the normal amount of solder paste 7 is not printed on two electrodes 5a* indicated by the arrow among the plural electrodes 5a due to printing failure in the printing apparatus M1, whereby the lower height measurement results are obtained than the other normal solder printing points.

Next, the paste height shortage determination section 32 determines whether the measured height of paste is right or wrong (ST3). Herein, if the height is normal for all the electrodes 5a and there is no shortage of the height, the operation proceeds directly to an electronic component placing process (ST7) to perform the component placing operation. If there is any shortage of the height, the paste transfer determination section 41 determines whether or not the transfer of paste is required for additional supply of the solder paste 7 (ST4). Herein, if it is determined that the shortage of height is extremely slight, and there is no adverse influence on the downstream operations, the component placing operation is performed in the same manner as previously described.

On the contrary, if the extent of height shortage is not negligible in the range and the shortage amount as in the example of FIG. 9B, it is determined that the paste transfer is required at (ST4), whereby the paste transfer is performed as will be described later. In this embodiment, to prevent nonconformity that the solder paste 7 is added excessively to the electrode 5a without height shortage, a process for adequately setting the range of paste transfer and the transfer amount is performed (ST5).

Figure 9C:
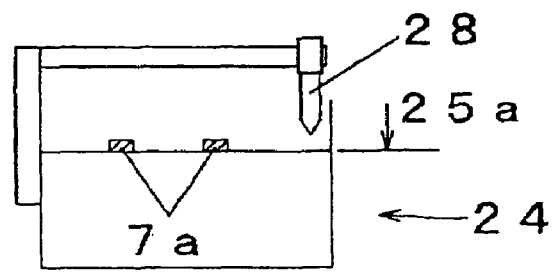

That is, the film 7a is formed in the size according to the required transfer amount at the position corresponding to the electrode 5a determined as height shortage on the film formation face 25a of the paste transfer unit 24, as shown in FIG. 9C. This processing is performed when the placing control section 40 drives the squeegee drive section 45 by referring to the height measurement result acquired in the printing inspection apparatus M2 and the film formation operation pattern stored in the squeegee movement data storage section 42. That is, the paste transfer unit 24 forms the film 7a on the film formation face 25a, based on the measurement result in the solder height measuring process.

Figure 10A:
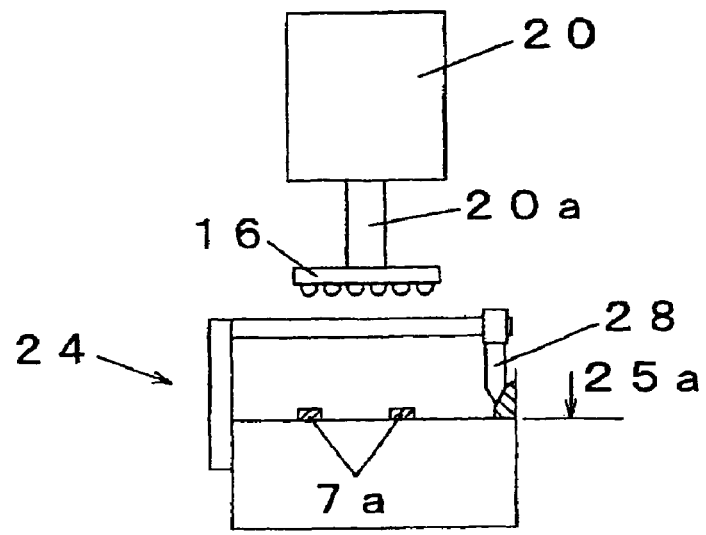
FIGS. 10A to 10C are explanatory views showing the process of the electronic component mounting method according to one embodiment of the invention.
Figure 10B:
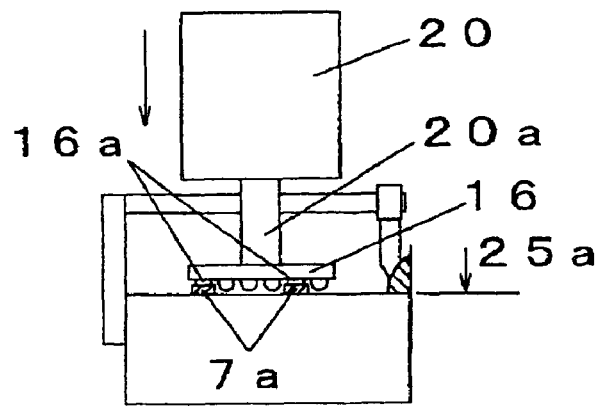
Figure 10C:
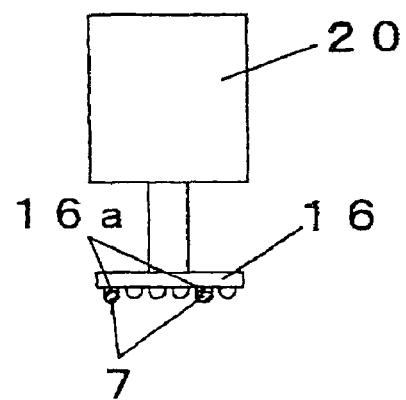

Next, the paste transfer operation is performed (ST6). That is, the mounting head 19 taking the electronic component 16 out of the second component supply section 13B is moved above the paste transfer unit 24, and the unit mounting head 20 is positioned so that the solder bumps 16a corresponding to the film 7a formed on the film formation face 25a may be correctly aligned, as shown in FIG. 10A. Then, the solder bumps 16a of transfer object, namely, the solder bumps 16a at the positions corresponding to the electrodes 5a determined as height shortage is made contact with the film 7a by causing the electronic component 16 held in the mounting head 19 to descend to the film formation face 25a (paste transfer process), as shown in FIG. 10B. Thereby, a desired transfer amount of solder paste 7 is transferred to the solder bumps 16a for which the transfer is required in the electronic component 16, as shown in FIG. 10C.

Figure 11A:
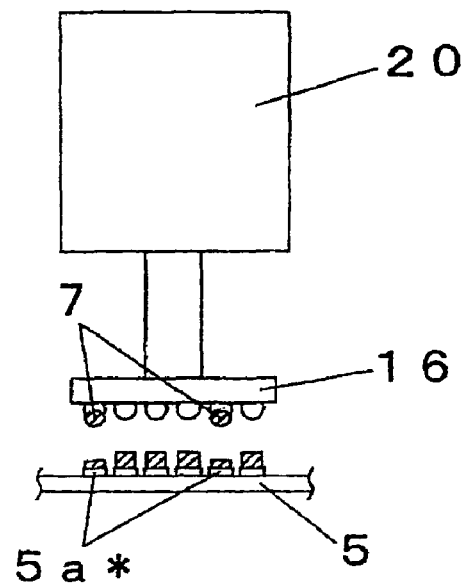
FIGS. 11A to 11C are explanatory views showing the process of the electronic component mounting method according to one embodiment of the invention.
Figure 11B:
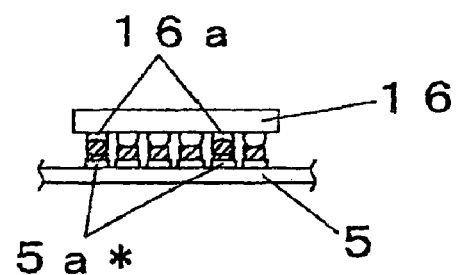

Next, the electronic component 16 is placed on the board 5 (ST7). That is, the mounting head 19 is moved to position the unit mounting head 20 holding the electronic component 16 after transfer of the solder paste 7 on the board 5, so that the solder bumps 16a are aligned with the electrodes 5a of the board 5, as shown in FIG. 11A. Thereby, the solder bumps 16a to which the solder paste 7 is transferred to correct the height shortage are located directly above the electrodes 5a* determined as height shortage in the paste height measurement. Next, the electronic component 16 is placed on the board 5 by causing the electronic component 16 to descend, and the solder bumps 16a are made to land on the electrodes 5a of the board 5 via the solder paste 7 (component placing process), as shown in FIG. 11B.

Figure 11C:
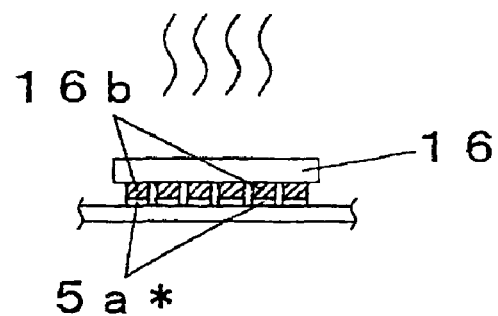

Thereafter, the board 5 with the electronic component 16 placed is carried into the reflow apparatus M4. And the board 5 is heated, together with the electronic component 16, up to the solder melting temperature or more, to melt the solder components in the solder bumps 16a and the solder paste 7 and join by soldering the electronic component 16 with the board 5 (reflow process) (ST8), as shown in FIG. 11C. At this time, the solder paste 7 additionally supplied to the solder bumps 16a by the transfer of paste compensates for a shortage of the solder amount in the electrodes 5a* with less amount of solder due to printing failure in the printing apparatus M1, whereby the amount of solder for joining the solder bumps 16a and the electrodes 5a is not insufficient. Thereby, the solder component in which the solder bumps 16a of the electronic component 16 are fused, together with the solder component in which the solder in the solder paste 7 is fused, normally connects all the solder bumps 16a with the electrodes 5a, so that the solder joints 16b electrically connecting the electronic component 16 with the electrodes 5a are excellently formed without causing a cold joint such as a faulty electrical continuity or shortage of junction strength, as shown in FIG. 11C.

That is, in the above electronic component mounting method, prior to the component placing process, the paste transfer determination section 41 determines whether or not the transfer of solder paste by the paste transfer unit 24 is required based on the right or wrong determination result of the height by the solder height measuring instrument. If it is determined that the transfer is required, the paste transfer operation for causing the electronic component held in the mounting head 19 to descend to the film formation face 25a is performed. Thereby, when the board causing a shortage of the solder amount due to printing failure is treated, the amount of solder is adequately added to assure the mounting quality.

INDUSTRIAL APPLICABILITY

The electronic component mounting system and the electronic component mounting method of the invention have the effect that it is possible to assure the mounting quality in treating the board causing a shortage of the solder amount due to printing failure, and are effective for the field where the electronic component is mounted on the board by means of soldering to manufacture the mounted board.

This application is based upon and claims the benefit of priority of Japanese Patent Application No. 2006-245229 filed on Sep. 11, 2006, the contents of which are incorporated herein by reference in its entirety.

The invention claimed is:

1. An electronic component mounting system having a plurality of electronic component mounting apparatuses connected for mounting an electronic component with a plurality of solder bumps formed on a lower surface on a board to manufacture a mounted board, said system comprising:
    a printing apparatus for printing the solder paste on the electrodes formed corresponding to said solder bumps on said board;
    a paste height measuring instrument for measuring the height of solder paste printed on said electrode and determining whether said height of solder paste is right or wrong individually for each said electrode based on the measurement result;
    an electronic component placing apparatus having a mounting head for taking the electronic component out of a component supply section and placing said electronic component on the board held in a board holding section, head movement means for moving said mounting head between said component supply section and the board holding section, and a paste transfer unit, disposed on a movement path of said mounting head, for transferring the solder paste to said solder bumps by causing the electronic component held in said mounting head to descend to a film formation face on which a film of solder paste is formed; and
    a paste transfer determination section for determining whether or not the transfer of solder paste by said paste transfer unit is required, based on the right or wrong determination result of said height by said paste height measuring instrument.

2. The electronic component mounting system according to claim 1, wherein said paste transfer unit forms said film on said film formation face based on the measurement result by said solder height measuring instrument.

3. An electronic component mounting method for mounting an electronic component with a plurality of solder bumps formed on a lower surface on a board to manufacture a mounted board, in which a plurality of electronic component mounting apparatuses are connected, said method including:
    a printing step of printing the solder paste on the electrodes formed corresponding to said solder bumps on said board;
    a paste height measuring step of measuring the height of solder paste printed on said electrode and determining whether said height of solder paste is right or wrong individually for each said electrode based on the measurement result; and
    a component placing step of placing the electronic component on said board after said paste height measuring step by an electronic component placing apparatus having a paste transfer unit for transferring the solder paste to said plurality of solder bumps by forming a film of solder paste on a film formation face and causing the electronic component held in said mounting head to descend to the film formation face on which the film of solder paste is formed;
    wherein prior to said component placing step, a paste transfer determination section determines whether or not the transfer of solder paste by said paste transfer unit is required, based on the right or wrong determination result of said height at said solder height measuring step, and if it is determined that the transfer is required, a paste transfer operation for causing the electronic component held in said mounting head to descend to said film formation face is performed.

4. The electronic component mounting method according to claim 3, wherein said paste transfer unit forms said film on said film formation face based on the measurement result at said solder height measuring step.

* * * * *